(12) United States Patent
Okumura et al.

(10) Patent No.: US 11,764,278 B2
(45) Date of Patent: Sep. 19, 2023

(54) SEMICONDUCTOR DEVICE, MANUFACTURING METHOD OF SEMICONDUCTOR DEVICE AND TESTING DEVICE

(71) Applicant: ADVANTEST CORPORATION, Tokyo (JP)

(72) Inventors: Kensuke Okumura, Miyagi (JP); Tomoo Yamanouchi, Miyagi (JP)

(73) Assignee: ADVANTEST CORPORATION, Tokyo (JP)

( * ) Notice: Subject to any disclaimer, the term of this patent is extended or adjusted under 35 U.S.C. 154(b) by 44 days.

(21) Appl. No.: 17/203,805

(22) Filed: Mar. 17, 2021

(65) Prior Publication Data
US 2021/0320184 A1    Oct. 14, 2021

(30) Foreign Application Priority Data

Apr. 13, 2020   (JP) .................................. 2020-071866

(51) Int. Cl.
| | | |
|---|---|---|
| *H01L 29/45* | (2006.01) | |
| *H01L 29/778* | (2006.01) | |
| *H01L 29/66* | (2006.01) | |
| *H01L 29/40* | (2006.01) | |
| *H01L 29/51* | (2006.01) | |

(52) U.S. Cl.
CPC .......... *H01L 29/452* (2013.01); *H01L 29/401* (2013.01); *H01L 29/513* (2013.01); *H01L 29/66462* (2013.01); *H01L 29/7783* (2013.01)

(58) Field of Classification Search
CPC ... H01L 29/452; H01L 29/401; H01L 29/513; H01L 29/66462; H01L 29/7783; H01L 29/2003; H01L 29/402; H01L 29/42376; H01L 29/7787; H01L 29/778–7789;
(Continued)

(56) References Cited

U.S. PATENT DOCUMENTS

| | | |
|---|---|---|
| 8,586,994 B2 | 11/2013 | Joshin |
| 2007/0158692 A1 | 7/2007 | Nakayama et al. |

(Continued)

FOREIGN PATENT DOCUMENTS

| | | | |
|---|---|---|---|
| CN | 101002332 A | 7/2007 | |
| CN | 102969354 A * | 3/2013 | ......... H01L 29/0657 |

(Continued)

OTHER PUBLICATIONS

Office Action issued for counterpart Taiwanese Application 110108602, issued by the Taiwan Intellectual Property Office dated Oct. 20, 2021.
(Continued)

*Primary Examiner* — Shahed Ahmed

(57) ABSTRACT

Provided is a semiconductor device, including: a compound semiconductor layer; a first insulating film provided on the compound semiconductor layer; a second insulating film, which is formed of a material different from the first insulating film, provided on the first insulating film; and a gate electrode provided above the second insulating film. The first insulating film may include tantalum oxynitride, and the second insulating film may include a material with a larger band gap than tantalum oxynitride. The second insulating film may include aluminum oxynitride.

14 Claims, 13 Drawing Sheets

(58) Field of Classification Search
CPC ... H01L 29/122–127; H01L 29/15–158; H01L 2924/13064; H01L 23/5329–53295
See application file for complete search history.

(56) References Cited

U.S. PATENT DOCUMENTS

| | | |
|---|---|---|
| 2008/0237606 A1 | 10/2008 | Kikkawa |
| 2013/0056746 A1 | 3/2013 | Joshin |
| 2015/0270355 A1 | 9/2015 | Kuraguchi |
| 2015/0270379 A1 | 9/2015 | Kuraguchi |
| 2016/0013282 A1 | 1/2016 | Murakami |
| 2016/0190294 A1 | 6/2016 | Okamoto |
| 2016/0225857 A1 | 8/2016 | Saito |
| 2020/0075778 A1 | 3/2020 | Shih |
| 2020/0111876 A1 | 4/2020 | Wang |
| 2020/0373422 A1* | 11/2020 | Kuraguchi ......... H01L 29/4236 |
| 2020/0411675 A1* | 12/2020 | Kato .................. H01L 29/2003 |
| 2021/0111254 A1* | 4/2021 | Jones ................ H01L 29/404 |

FOREIGN PATENT DOCUMENTS

| | | |
|---|---|---|
| CN | 105742360 A | 7/2016 |
| JP | 2012174804 A | 9/2012 |
| JP | 2013041969 A | 2/2013 |
| TW | 201539753 A | 10/2015 |

OTHER PUBLICATIONS

Office Action issued for counterpart Taiwanese Application 110108602, issued by the Taiwan Intellectual Property Office dated Mar. 20, 2023.

\* cited by examiner

SEMICONDUCTOR DEVICE, MANUFACTURING METHOD OF SEMICONDUCTOR DEVICE AND TESTING DEVICE

The contents of the following Japanese patent application are incorporated herein by reference:
No. 2020-071866 filed in JP on Apr. 13, 2020

BACKGROUND

1. Technical Field

The present invention relates to a semiconductor device, a manufacturing method of a semiconductor device, and a testing device.

2. Related Art

Conventionally, a semiconductor device using a gate electrode, such as a High-Electron-Mobility Transistor (HEMT), has been known (for example, refer to Patent Document 1).
Patent Document 1: Japanese Patent Application Publication No. 2013-41969

In a semiconductor device, suppression of gate a leakage current between a gate electrode and a semiconductor layer is preferably compatible with suppression of a current collapse, where a source-drain current decreases due to carrier trapping on the surface of the semiconductor layer.

A first aspect of the present invention provides a semiconductor device including a compound semiconductor layer. The semiconductor device may include a first insulating film provided on the compound semiconductor layer. The semiconductor device may be provided on the first insulating film, and may include a second insulating film formed of a material with a larger band gap than the first insulating film. The semiconductor device may include a gate electrode provided above the second insulating film.

The first insulating film may include tantalum oxynitride. The second insulating film may include a material with a larger band gap than tantalum oxynitride.

The second insulating film may include aluminum oxynitride.

The semiconductor device may include a third insulating film having a first aperture for exposing the compound semiconductor layer below the gate electrode, which is provided between the first insulating film and the compound semiconductor layer. The first insulating film may be in contact with the compound semiconductor layer at the first aperture.

The first insulating film may have smaller film thickness when compared to the third insulating film.

The film thickness of the third insulating film may be 20 nm or less.

The semiconductor device may include a source electrode and a drain electrode provided between the compound semiconductor layer and the first insulating film. The semiconductor device may include a first barrier metal layer including a material more resistant to corrosion from an alkaline solution than the source electrode and the drain electrode, which is provided above the source electrode and the drain electrode. The semiconductor device may include a second barrier metal layer including platinum, which is provided above the first barrier metal layer. The first insulating film and the second insulating film may have a second aperture for exposing the second barrier metal layer.

The first barrier metal layer may include titanium.

The second barrier metal layer may have film thickness smaller than the first barrier metal layer.

The film thickness of the first barrier metal layer may be 100 nm or more. The film thickness of the second barrier metal layer may be 10 nm or more.

A second aspect of the present invention provides a manufacturing method of a semiconductor device. The manufacturing method may include forming a semiconductor layer of a compound semiconductor layer. The manufacturing method may include forming a first insulating film on the compound semiconductor layer. The manufacturing method may include forming a second insulating film with a different material from the first insulating film above the first insulating film. The manufacturing method may include forming a gate electrode above the second insulating film.

The manufacturing method may include forming a third insulating film on the compound semiconductor layer between forming the semiconductor layer and forming the first insulating film. The manufacturing method may include a first etching for etching the third insulating film, and for forming a first aperture for exposing the compound semiconductor layer below the gate electrode. In forming the first insulating film, the first insulating film may be formed to be in contact with the compound semiconductor layer at the first aperture.

The manufacturing method may include forming a source electrode and a drain electrode on the compound semiconductor layer between forming the semiconductor layer and forming the first insulating film. The manufacturing method may include forming a first barrier metal layer including a material more resistant to corrosion from an alkaline solution than the source electrode and the drain electrode above the source electrode and the drain electrode, and forming a second barrier metal layer including platinum above the first barrier metal layer, between forming the source-drain electrode and forming the first insulating film. The manufacturing method may include forming a second etching for forming a second aperture by wet etching the second insulating film with an alkali solution after forming the second insulating film.

A third aspect of the present invention provides a testing device for testing a device under test. The testing device may include a testing section for transmitting an electrical signal with the device under test in between, and for testing the device under test. The testing device may include a semiconductor device according to the first aspect provided in a transmission path between the device under test and the testing section, for switching between electrical connection or disconnection between the device under test and the testing section.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. Further, not all of the combinations of features described in the embodiments are essential for means to solve the problem in the invention.

As used in the present specification, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which the semiconductor device is mounted. In the present specification, the orthogonal axes parallel to the upper surface and lower surface of the semiconductor substrate are the X axis and Y axis.

Figure 1:
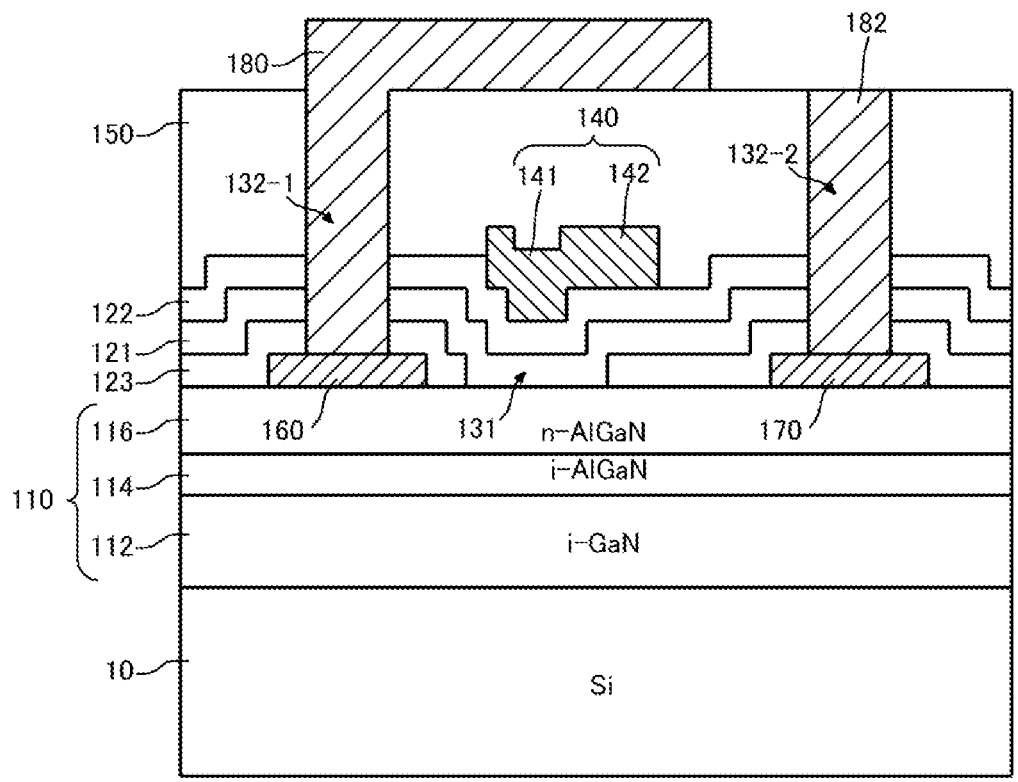
FIG. 1 illustrates a configuration example of a cross section of a semiconductor device 100 according to one embodiment of the present invention.

FIG. 1 illustrates a configuration example of a cross section of a semiconductor device 100 according to one embodiment of the present invention. The semiconductor device 100 in this example includes a compound semiconductor layer 110, a first insulating film 121, a second insulating film 122 and a gate electrode 140. The compound semiconductor layer 110 is a semiconductor layer formed of a compound material such as gallium nitride (GaN), aluminum gallium nitride (AlGaN), or silicon carbide (SiC). The compound semiconductor layer 110 in the example of FIG. 1 is a semiconductor layer formed of nitride (GaN or AlGaN).

The gate electrode 140 is an electrode formed of a conductive material such as aluminum. The gate electrode 140 is arranged above an upper surface of the compound semiconductor layer 110. The first insulating film 121 and the second insulating film 122 are arranged between the gate electrode 140 and the compound semiconductor layer 110.

In this way, the gate electrode 140 is insulated from the compound semiconductor layer 110. The gate electrode 140 is configured to control a current flowing through the compound semiconductor layer 110 by applying a predetermined gate voltage. The gate electrode 140 may control a current flowing in a direction parallel to the upper surface of the compound semiconductor layer 110.

The semiconductor device 100 may be a High-Electron-Mobility Transistor (HEMT). In this case, by applying a predetermined gate voltage to the gate electrode 140, the concentration of a two-dimensional electron gas in the electron transit layer of the compound semiconductor layer 110 is controlled. The semiconductor device 100 shown in FIG. 1 is a HEMT. The semiconductor device 100 may also be a Field-Effect Transistor (FET). In this case, by applying a predetermined gate voltage to the gate electrode 140, a channel in the vicinity of the upper surface of the compound semiconductor layer 110 is controlled.

The semiconductor device 100 in this example is configured to suppress the current collapse while reducing the gate leak current flowing between the gate electrode 140 and the compound semiconductor layer 110, by stacking an insulating film between the gate electrode 140 and the compound semiconductor layer 110. The current collapse is a phenomenon where a current flowing through a semiconductor layer decreases due to the effect of a trap formed on the upper surface of the semiconductor layer. For example, a phenomenon is known that when the semiconductor device 100 is turned to an ON state after the semiconductor device 100 has been turned to an OFF state by applying a predetermined off-stress voltage to the gate electrode, the drain current flowing between the drain and source decreases compared to the case where no off-stress voltage is applied.

The first insulating film 121 is provided on the compound semiconductor layer 110. Being provided on the compound semiconductor layer 110 means that at least a part of the first insulating film 121 is in contact with the compound semiconductor layer 110. The first insulating film 121 in this example is in contact with the compound semiconductor layer 110 below the gate electrode 140. The region below the gate electrode 140 refers to the region that overlaps the gate electrode 140 when viewed from the Z axis direction. That is, the first insulating film 121 is in contact with the compound semiconductor layer 110 in at least a part of the region overlapping the gate electrode 140 when viewed from the Z axis direction.

The second insulating film 122 is provided on the first insulating film 121. That is, at least a part of the second insulating film 122 is in contact with the upper surface of the first insulating film 121. Also, the second insulating film 122 is not in contact with the compound semiconductor layer 110. The second insulating film 122 is formed of a different material from the first insulating film 121. That is, the gate electrode 140 is insulated from the compound semiconductor layer 110 by a stacked insulating film formed of a heterogeneous material. According to such a configuration, a gate leak current can be suppressed by one insulating film and a current collapse can be suppressed by the other insulating film, thereby the gate leakage current suppression is easier to be compatible with the current collapse suppression.

It is preferable that the first insulating film 121 is formed of a material that will reduce the number of a trap formed on the upper surface of the compound semiconductor layer 110 compared to the case where the second insulating film 122 is formed on the compound semiconductor layer 110. A trap is a surface level configured to supplement an electron. The first insulating film 121 includes, for example, tantalum oxynitride (TaON). The entire first insulating film 121 may be tantalum oxynitride. At the interface with the compound semiconductor layer 110, tantalum oxynitride can form a good interface with less trap density when compared to tantalum oxide, silicon dioxide and so on. This enables the suppression of a current collapse.

The second insulating film 122 includes a material with a larger band gap than the first insulating film 121. That is, the second insulating film 122 includes a material with higher insulating properties than the first insulating film 121. The entire second insulating film 122 may be formed of the material. When the first insulating film 121 includes tantalum oxynitride, the second insulating film 122 includes a material with a larger band gap than tantalum oxynitride. As one example, the second insulating film 122 is formed of aluminum oxynitride (AlON). This enables the suppression of a gate leak current. The second insulating film 122 may also be silicon oxynitride (SiON), silicon dioxide ($SiO_2$) and so on.

The semiconductor device 100 in this example further includes a substrate 10, a third insulating film 123, a protective film 150, a source electrode 160, a drain electrode 170, a source runner 180 and a drain runner 182. The substrate 10 is a substrate on which the compound semiconductor layer 110 is formed on the upper surface. As one example, the compound semiconductor layer 110 is formed by epitaxial growth on the upper surface of the substrate 10. The substrate 10 may be a crystal with a lattice constant that is substantially identical to the lattice constant of the compound semiconductor layer 110 so that it can be formed while maintaining the crystallinity of the compound semiconductor layer 110. As one example, the substrate 10 may be a single crystal such as sapphire, SiC (silicon carbide), GaN, GaAs, or Si.

The compound semiconductor layer 110 in this example is formed by a nitride semiconductor. The compound semiconductor layer 110 may have a heterojunction, in which two or more types of semiconductors with different band gaps are bonded together while still having crystalline properties. In the present embodiment, the compound semiconductor layer 110 has an electron transit layer 112, a spacer layer 114, and an electron supplying layer 116.

The electron transit layer 112 is formed on the upper surface of the substrate 10. In the electron transit layer 112, a two-dimensional electron gas is formed that allows an electron to flow at high speed. The electron transit layer 112 in this example is an undoped i-type GaN layer in which an impurity is intentionally not added.

The spacer layer 114 is formed on the electron transit layer 112. The spacer layer 114 is formed of a heterogeneous semiconductor material with a different band gap from the electron transit layer 112. By making the electron transit layer 112 and the spacer layer 114 a heterojunction, the electron transit layer 112 can form a two-dimensional electron gas in the region near the interface with the spacer layer 114. The spacer layer 114 in this example is an undoped i-type AlGaN layer.

The electron supplying layer 116 is formed on the spacer layer 114. The electron supplying layer 116 is configured to supply an electron to the electron transit layer 112 via the spacer layer 114. The electron supplying layer 116 in this example is an n-type AlGaN layer doped with an impurity.

The compound semiconductor layer 110 may further has a protective layer on the electron supplying layer 116. The protective layer is configured to suppress the oxidation of Al or the like inside the electron supplying layer 116, for example. The protective layer is, for example, an n-type GaN layer doped with an impurity.

The source electrode 160 and the drain electrode 170 are provided on the compound semiconductor layer 110. The source electrode 160 and the drain electrode 170 are arranged to sandwich the gate electrode 140 in the XY plane. The source electrode 160 and the drain electrode 170 in this example are in contact with the electron supplying layer 116. The source electrode 160 and the drain electrode 170 are ohmic bonded to the compound semiconductor layer 110. The source electrode 160 and the drain electrode 170 may have Ni (nickel), Pt (platinum), Au (gold), Mo (molybdenum), Al (aluminum), Ti (titanium) or the like.

The third insulating film 123 is provided between the first insulating film 121 and the compound semiconductor layer 110. The third insulating film 123 in this example is provided to cover the compound semiconductor layer 110, the source electrode 160 and the drain electrode 170. Note that the third insulating film 123 has a first aperture 131 for exposing the compound semiconductor layer 110. The first aperture 131 is arranged between the source electrode 160 and the drain electrode 170, and is arranged in a region overlapping the gate electrode 140 in the XY plane. The first insulating film 121 is in contact with the compound semiconductor layer 110 at the first aperture 131.

The third insulating film 123 may be formed of a material identical to the first insulating film 121. For example, the third insulating film 123 is tantalum oxynitride. The third insulating film 123 may be formed of a material different from the first insulating film 121. For example, the third insulating film 123 is aluminum nitride (AlN) or silicon nitride (SiN).

By providing the third insulating film 123 and the first aperture 131, a depression is formed in the first insulating film 121 and the second insulating film 122 above the first aperture 131. The gate electrode 140 has a body portion 141 arranged on the depression, and a stepped portion 142 arranged outside the depression. The stepped portion 142 may extend outward from the first aperture 131 in the XY plane. The stepped portion 142 in this example is configured to cover at least a part of the region between the first aperture 131 and the drain electrode 170 in the XY plane. Since the body portion 141 is arranged on the depression, the distance from the compound semiconductor layer 110 is small. Therefore, when a gate voltage is applied, it becomes easier to control the current of the compound semiconductor layer 110. Also, by covering the compound semiconductor layer 110 with the metallic stepped portion 142, it becomes easier to protect the compound semiconductor layer 110.

The protective film 150 is an isolative film provided on the gate electrode 140 and the second insulating film 122. The protective film 150 may include a different type of isolative material from the second insulating film 122. As one example, the protective film 150 includes SiN (silicon nitride) as an isolative material.

Two second apertures 132 are formed on the protective film 150, the second insulating film 122, the first insulating film 121 and the third insulating film 123. The second aperture 132-1 is an aperture for exposing the source electrode 160, with a source runner 180 provided inside. The second aperture 132-2 is an aperture for exposing the drain electrode 170, with a drain runner 182 provided inside. The source runner 180 and the drain runner 182 may be formed of an identical material to the source electrode 160 and the drain electrode 170, or may be formed of a different material. At least one of the source runner 180 and the drain runner 182 may be formed on the protective film 150. At least one of the source runner 180 and the drain runner 182 may be electrically connected to an external circuit by a wire-bonding or the like.

Figure 2:
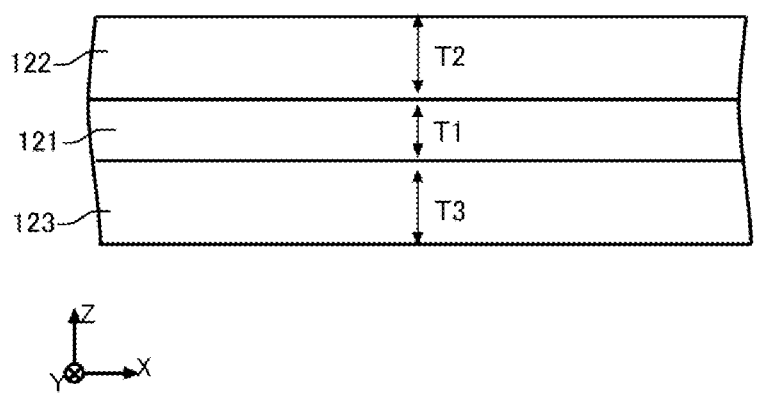
FIG. 2 illustrates a figure describing film thickness T1 of a first insulating film 121, film thickness T2 of a second insulating film 122, and film thickness T3 of a third insulating film 123.

FIG. 2 illustrates a figure describing film thickness T1 of the first insulating film 121, film thickness T2 of the second insulating film 122 and film thickness T3 of the third insulating film 123. The film thickness of each film refers to the thickness in the Z axis direction. Also, film thickness of each film may use an average value of the film thickness at each position in the XY plane.

The film thickness T1 may be smaller than any of the film thickness T2 and the film thickness T3. The film thickness T1 of the first insulating film may be small as long as the first insulating film is in contact with the compound semiconductor layer 110, since the film thickness T1 may be capable to reduce the number of the trap at the interface with the compound semiconductor layer 110. The film thickness T1 may be 20 nm or less, or may be 10 nm or less, or may be 5 nm or less, or may be 1 nm or less. By reducing the film thickness T1, the shift to the negative side of the threshold voltage, which causes the semiconductor device 100 to transition to the ON state, can be suppressed. The film thickness T1 may be the thickness of one atomic layer or more, or may be 5 nm or more.

The film thickness T3 is preferred to have thickness to a certain extent in order to form a level difference at the first aperture 131. However, if the film thickness T3 is too large, the film to be formed above the third insulating film 123 may be cut off by the level difference. The film thickness T3 may be 20 nm or less. Note that the film thickness T3 is larger than the film thickness T1. The film thickness T3 may be 5 nm or more, or may be 10 nm or more.

The film thickness T2 may be larger than the film thickness T1. By increasing the film thickness T2 of the second insulating film 122, it becomes easier to suppress the gate leak current. The film thickness T2 may be larger than 20 nm. Note that each film thickness is not limited to the example described in FIG. 2.

Figure 3:
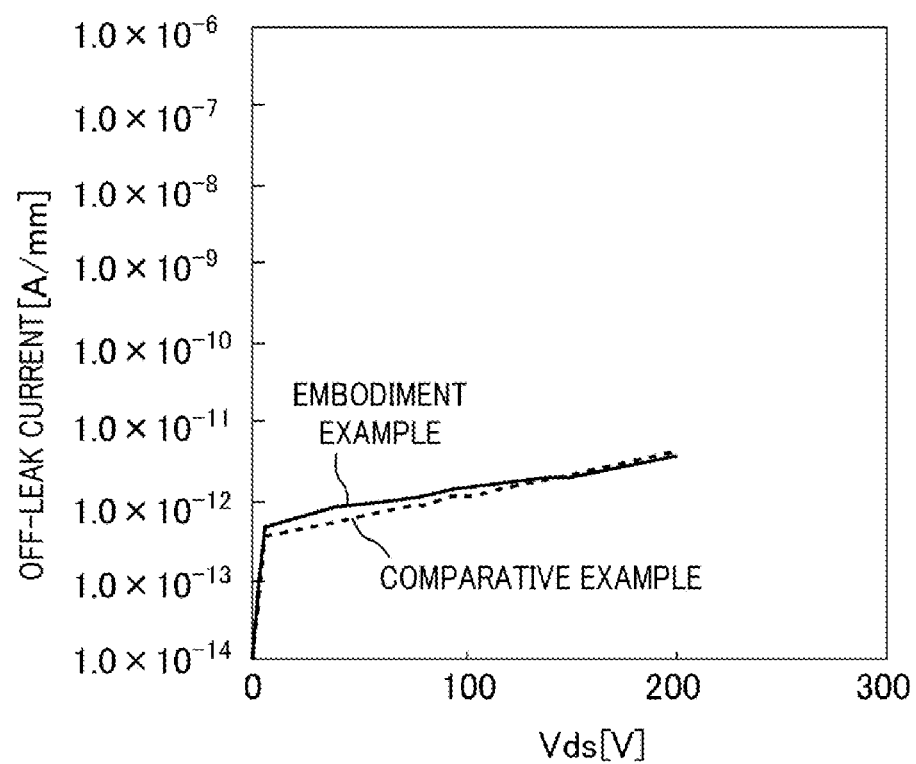
FIG. 3 illustrates a measurement result of a gate leak current in an embodiment example and a comparative example.

FIG. 3 illustrates a measurement result of the gate leak current in an embodiment example and a comparative example. In FIG. 3, the horizontal axis is the source drain voltage Vds, and the vertical axis is the gate leak current. The embodiment example has a structure shown in FIG. 1. Note that the third insulating film 123 and the first insulating film 121 are tantalum nitride, and the second insulating film 122 is aluminum oxynitride. Also, in the comparative example does not have the first insulating film 121 in the structure shown in FIG. 1. That is, in the comparative example, the second insulating film 122 is in contact with the compound semiconductor layer 110 at the first aperture 131. As shown in FIG. 3, the embodiment example has the same off-leak current as the comparative example.

Figure 4:
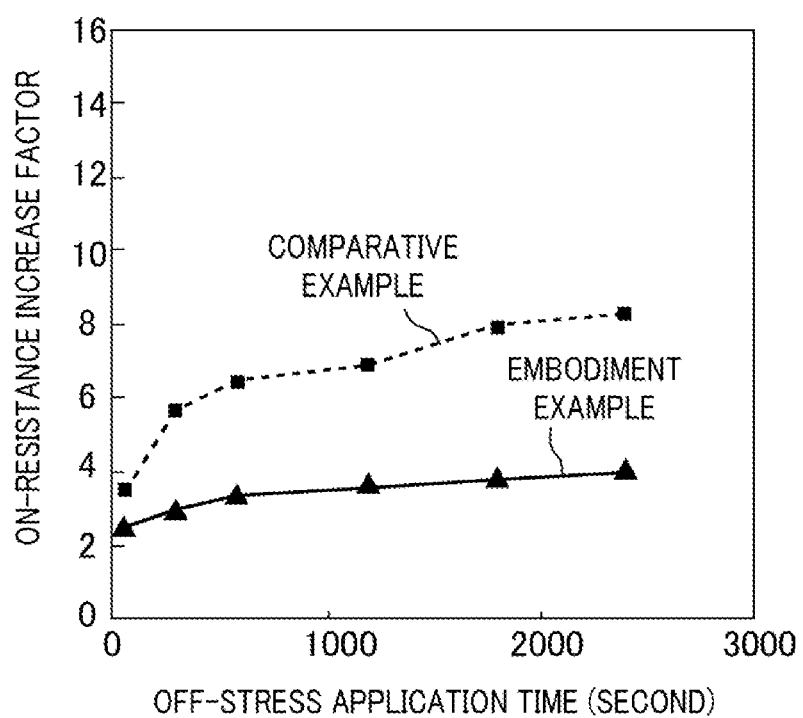
FIG. 4 illustrates a measurement result of a current collapse of an embodiment example and a comparative example.

FIG. 4 illustrates a measurement result of a current collapse in the embodiment example and the comparative example. In FIG. 4, the horizontal axis indicates the off-stress application time, and the vertical axis indicates the on-resistance increase factor. The off-stress application time is a period during which the semiconductor device 100 is turned to the OFF state by applying a predetermined off-stress voltage to the gate electrode 140. In this example, the off-stress voltage is 200 V. The on-resistance increase factor is the ratio Ron1/Ron2 between the on-resistance Ron1 immediately after the application of the off-stress voltage has been stopped and the semiconductor device 100 has been turned to the ON state, and the on-resistance Ron2 in a state where the off-stress voltage is not applied. When an electron is trapped at the interface of the compound semiconductor layer 110 due to a current collapse, the on-resistance of the semiconductor device 100 increases.

As shown in FIG. 4, the on-resistance increase factor of the embodiment example has been allowed to be suppressed to approximately half of the on-resistance increase factor of the comparative example. In the comparative example, the second insulating film 122 is in contact with the compound semiconductor layer 110 below the gate electrode 140, whereas in the embodiment example, the first insulating film 121 is in contact with the compound semiconductor layer 110 below the gate electrode 140, which is considered to be because there is less trap at the interface of the compound semiconductor layer 110.

Figure 5:
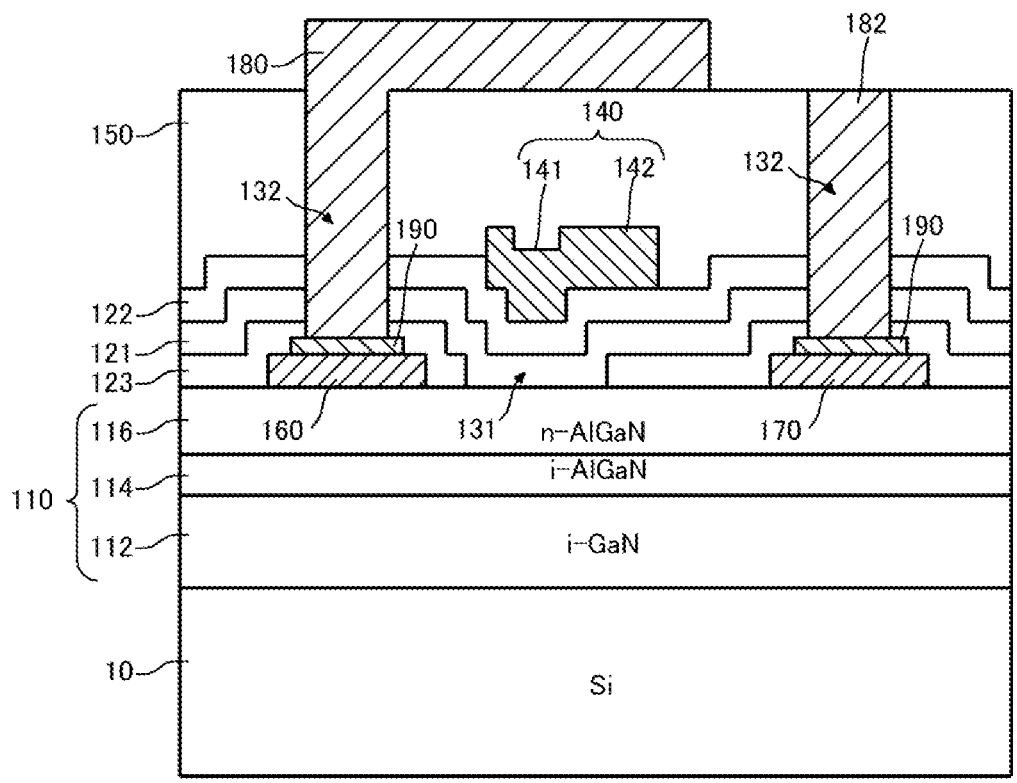
FIG. 5 illustrates another exemplary structure of the semiconductor device 100.

FIG. 5 illustrates another exemplary structure of the semiconductor device 100. The semiconductor device 100 in this example further includes a barrier metal portion 190 to the structure of the semiconductor device 100 described in FIG. 1 to FIG. 4. The other structure is the same as the example described in FIG. 1 to FIG. 4.

The barrier metal portion 190 is provided above the source electrode 160 and the drain electrode 170. The barrier metal portion 190 is arranged between the source electrode 160 and the source runner 180, and between the drain electrode 170 and the drain runner 182. The barrier metal portion 190 may cover the entire lower surface of each runner. That is, each runner is not in contact with each electrode. The barrier metal portion 190 may also cover the entire upper surface of each electrode.

The barrier metal portion 190 in this example includes a material that is more resistant to corrosion from an alkaline solution than the source electrode 160 and the drain electrode 170. The barrier metal portion 190 may include titanium (Ti), or may include platinum (Pt). The barrier metal portion 190 can be provided to protect each electrode.

Figure 6:
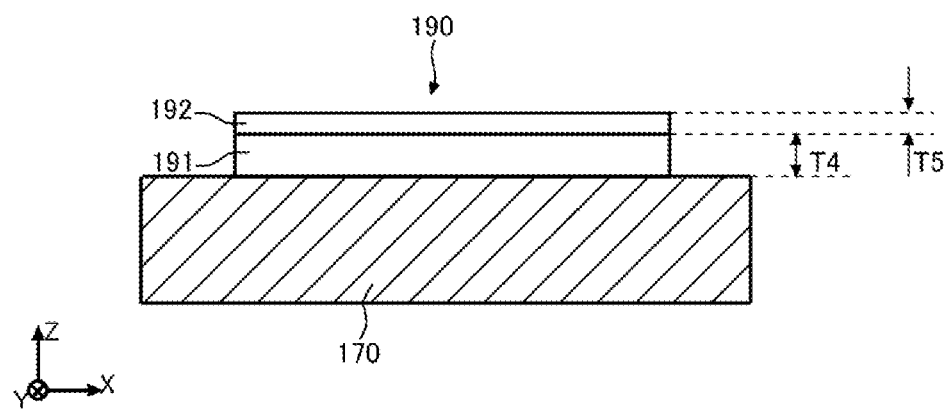
FIG. 6 illustrates a configuration example of a barrier metal portion 190.

FIG. 6 illustrates a configuration example of the barrier metal portion 190. In FIG. 6, although the barrier metal portion 190 on the drain electrode 170 is shown, the barrier metal portion 190 on the source electrode 160 may have the identical structure.

The barrier metal portion 190 in this example has a first barrier metal layer 191 and a second barrier metal layer 192. The first barrier metal layer 191 is provided above the source electrode 160 and the drain electrode 170 and includes a material that is more resistant to corrosion from an alkaline solution than the source electrode 160 and the drain electrode 170. The first barrier metal layer 191 may include titanium. The entire first barrier metal layer 191 may be titanium. The first barrier metal layer 191 may also be a layer of chromium (Cr). Also, the first barrier metal layer 191 may also have a stacking structure with a tantalum layer stacked on a titanium layer.

In the semiconductor device 100 in this example, a second insulating film 122 formed of aluminum oxynitride is provided above the source electrode 160 and the drain electrode 170. The second insulating film 122 can be easily etched by wet etching with an alkali solution, and then a second aperture 132 can be formed. However, after performing wet etching with an alkali solution, the source electrode 160 and the drain electrode 170 may also be etched. In this example, the first barrier metal layer 191 can be provided to protect the source electrode 160 and the drain electrode 170.

The first barrier metal layer 191 is preferably thicker than the depth of the unevenness of the upper surface of the source electrode 160 or the drain electrode 170. In this way, the convex portion of the source electrode 160 or the drain electrode 170 can be prevented from being exposed in the second aperture 132. The film thickness T4 of the first barrier metal layer 191 may be 100 nm or more. The film thickness T4 of the first barrier metal layer 191 may be 200 nm or more.

The second barrier metal layer 192 is provided above the first barrier metal layer 191, including platinum. The entire second barrier metal layer 192 may be platinum. Note that the second aperture 132 is configured to expose the second barrier metal layer 192. Each runner provided at the second aperture 132 is connected to the second barrier metal layer 192. The second barrier metal layer 192 can be provided to suppress the oxidation of the first barrier metal layer 191. Also, the barrier metal portion 190 can be made into a stacking structure to reduce the material cost when compared to the case where the entire barrier metal portion 190 is formed of platinum.

The film thickness T5 of the second barrier metal layer 192 may be smaller than the film thickness T4 of the first barrier metal layer 191. The film thickness of each layer may use an average film thickness at each position in the XY plane. The film thickness of each layer may also use an average film thickness of a region overlapping each runner (the source runner 180 or the drain runner 182) in the XY plane.

Since the second barrier metal layer 192 may be capable to function as an antioxidant film, the film thickness may be smaller than the first barrier metal layer 191. The film thickness T5 may be 10 nm or more and smaller than 100 nm. The film thickness T5 may be half or less, or may be 10% or less of the film thickness T4.

Figure 7:
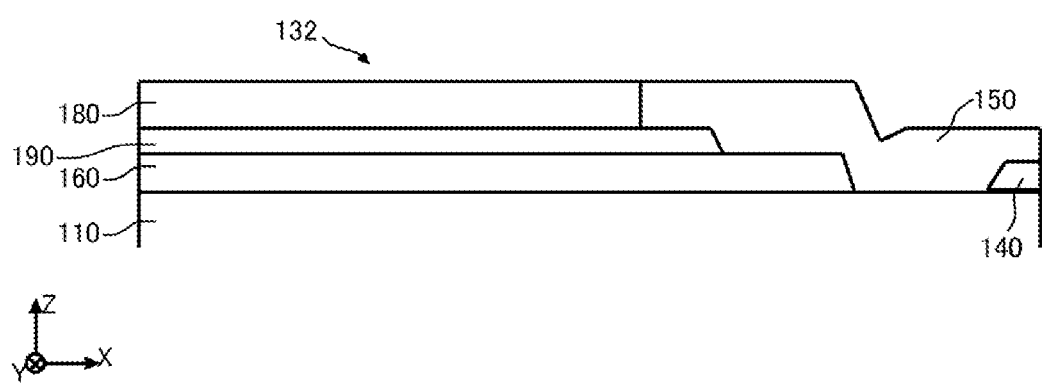
FIG. 7 schematically illustrates a photomicrograph of a cross section of the semiconductor device 100 according to an embodiment example.

FIG. 7 schematically illustrates a photomicrograph of a cross section of the semiconductor device 100 according to the embodiment example. In FIG. 7, a cross section in the vicinity of the source electrode 160 is shown. The semiconductor device 100 in this example is different from the structure described in FIG. 1 to FIG. 6 in the thickness of each film. Also, since the film thickness of the first insulating film 121, the second insulating film 122 and the third insulating film 123 is small, these insulating films are omitted in FIG. 7.

In this example, a barrier metal portion 190 is provided on the source electrode 160. The second aperture 132 is configured to expose the upper surface of the barrier metal portion 190, and the source runner 180 provided inside the second aperture 132 is connected to the barrier metal portion 190. A protective film 150, a first insulating film 121, a second insulating film 122 and a third insulating film 123 and so on are arranged between the gate electrode 140 and the source electrode 160.

Figure 8:
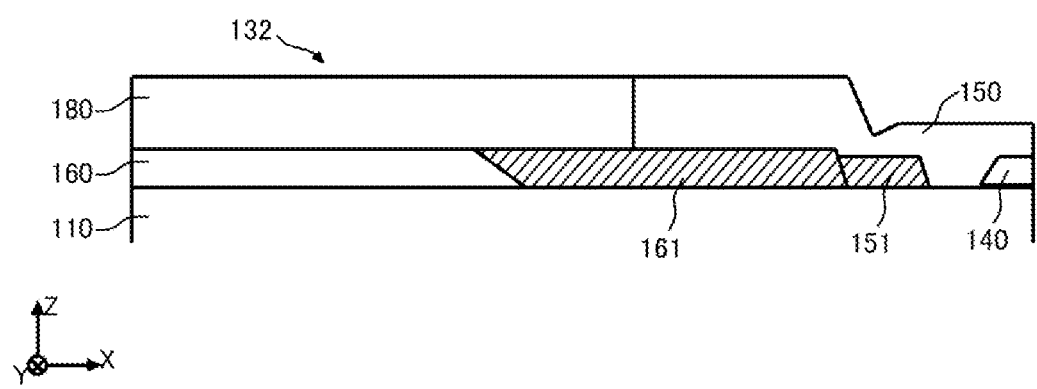
FIG. 8 schematically illustrates a photomicrograph of a cross section of the semiconductor device 100 according to a comparative example.

FIG. 8 schematically illustrates a photomicrograph of a cross section of the semiconductor device according to the comparative example. In this example, the second aperture 132 is configured to expose the upper surface of the source electrode 160, and the source runner 180 is connected to the source electrode 160.

In the comparative example, since the barrier metal portion 190 is not provided, in the process of forming the second aperture 132, the source electrode 160 and the protective film 150 may also be etched. In FIG. 8, the etched source electrode 160 is referred to as an etching region 161, and the etched protective film 150 is referred to as an etching region 151. When the etching region 151 is generated, since the protective film 150 enclosing the gate electrode 140 becomes thinner, the insulating property of the gate electrode 140 is to be degraded. For example, if the source runner 180 enters the etching region 151 and etching region 161, the insulating property between the gate electrode 140 and the source runner 180 is to be degraded. On the other hand, according to the embodiment example shown in FIG. 7, since the barrier metal portion 190 is provided, the source electrode 160 and the drain electrode 170 can be suppressed to be etched.

Figure 9:
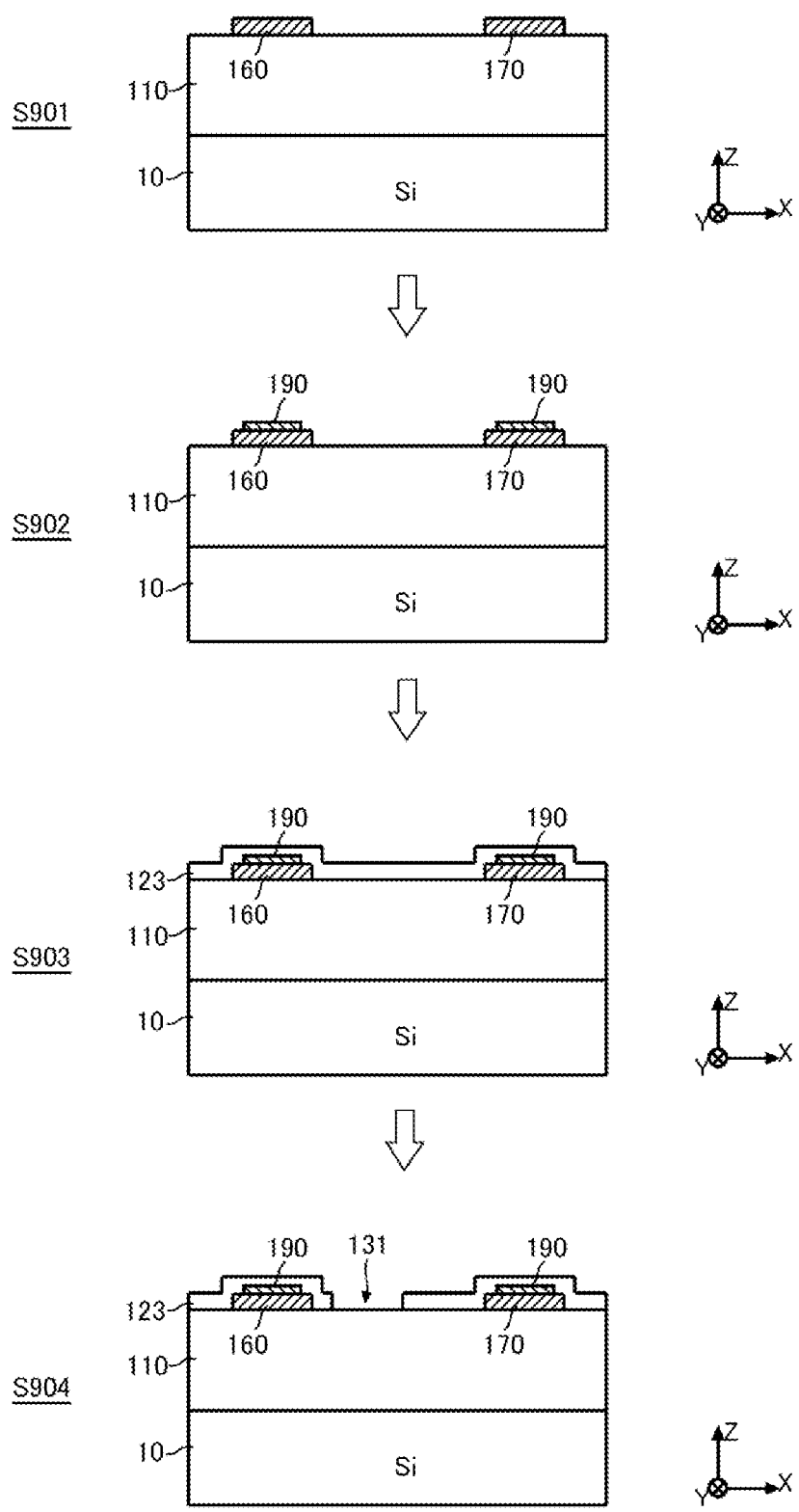
FIG. 9 illustrates one example of a manufacturing process of the semiconductor device 100.

FIG. 9 illustrates one example of a manufacturing process of the semiconductor device 100. Firstly in forming the semiconductor layer S901, a compound semiconductor layer 110 is formed on the substrate 10. The compound semiconductor layer 110 may be formed by the MOVPE (Metal Organic Vapor Phase Epitaxy) method, the MBE (Molecular Beam Epitaxy) method or the like.

Then, the source electrode 160 and the drain electrode 170 are formed on the compound semiconductor layer 110. The source electrode 160 and the drain electrode 170 may be an electrode stacked by tantalum layer/aluminum layer/tantalum layer.

The source electrode 160 and the drain electrode 170 is, as one example, formed by the vapor deposition method in which a material is heated to vaporize or sublimate and then adheres to the surface of a substrate. Alternatively, the source electrode 160 and the drain electrode 170 may be formed by the sputtering method. Also, the source electrode 160 and the drain electrode 170, as one example, are formed by the vapor deposition lift-off method, in which the reverse pattern of the pattern to be formed is formed on the substrate with photoresist or the like, and after the thin film to be formed is vapor deposited, the unwanted portion other than the pattern are removed together with the photoresist. Also, the compound semiconductor layer 110, in which the source electrode 160 and the drain electrode 170 are formed, is annealed at a temperature of approximately 500° C. or higher to form an ohmic bonding between the electrode and the compound semiconductor layer 110.

Then, in forming a barrier metal S 902, a barrier metal portion 190 is formed on the source electrode 160 and the drain electrode 170. In forming a barrier metal S 902, as shown in FIG. 6 and so on, a first barrier metal layer 191 is formed above the source electrode 160 and the drain electrode 170, and a second barrier metal layer 192 is formed above the first barrier metal layer 191. The barrier metal portion 190 may be formed by the same method as the source electrode 160 and the drain electrode 170.

Then, in forming a third insulating film S903, a third insulating film 123 is formed on the compound semiconductor layer 110, the source electrode 160 and the drain electrode 170. Each insulating film of the first insulating film 121, the second insulating film 122 and the third insulating film 123 may be formed by sputtering. Each insulating film is, as one example, formed by RF sputtering, in which the sputtering is performed by applying a high-frequency voltage to an insulating material target.

Then, in the first etching S 904, the third insulating film 123 is etched, and the first aperture 131 for exposing the upper surface of the compound semiconductor layer 110 is formed. The first aperture 131 is formed to be arranged below the gate electrode 140 formed by the following process. In the first etching S 904, the third insulating film 123 may be etched by dry etching.

Figure 10:
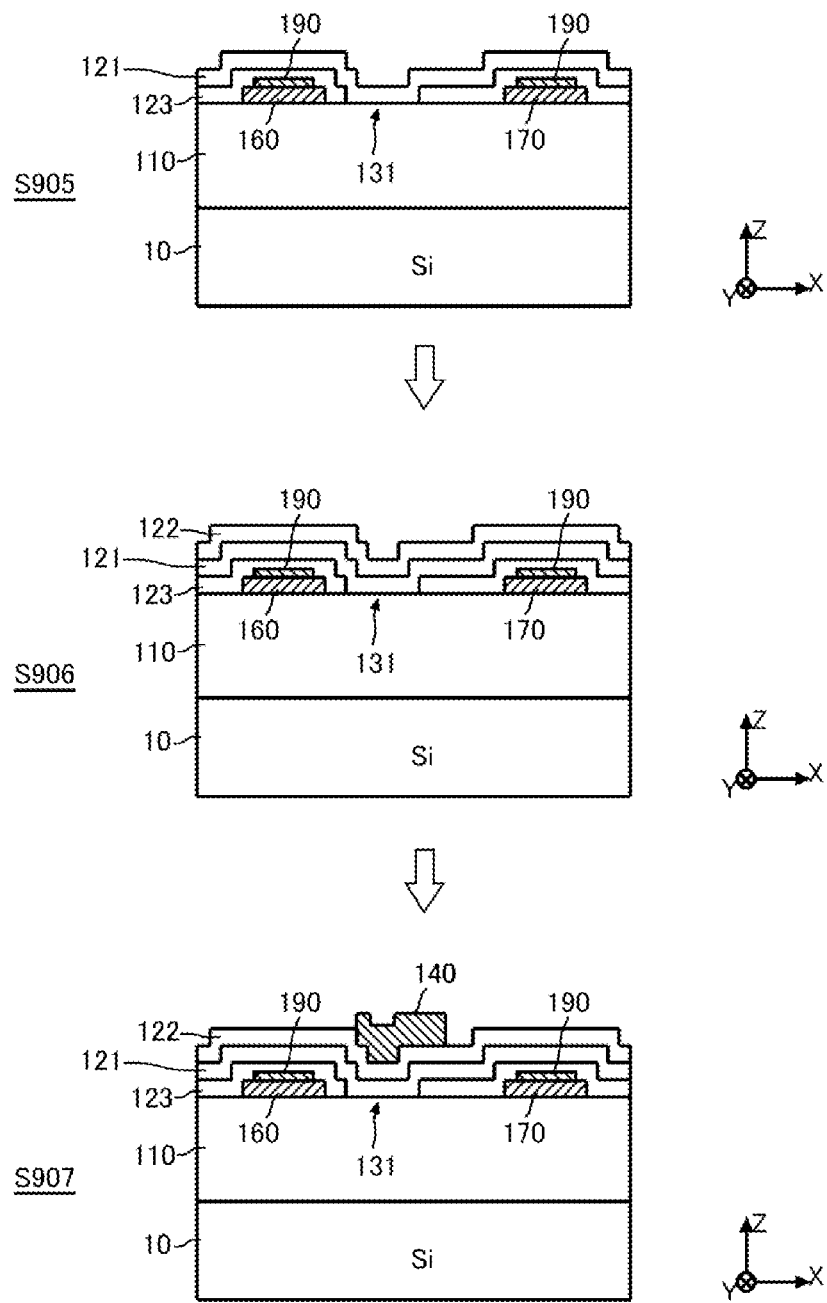
FIG. 10 illustrates an example of a process after a first etching S904.

FIG. 10 illustrates an example of a process after the first etching S 904. In this example, in forming a first insulating film S 905, the first insulating film 121 is formed on the third insulating film 123 and the compound semiconductor layer 110. In forming a first insulating film S 904 in this example, the first insulating film 121 is formed to be in contact with the compound semiconductor layer 110 at the first aperture 131. The first insulating film 121 may cover the entire third insulating film 123 and the entire first aperture 131. The first insulating film 121 in this example has a depression above the first aperture 131.

Then, in forming a second insulating film S906, a second insulating film 122, which is formed of a different material from the first insulating film 121, is formed above the first insulating film 121. The second insulating film 122 may cover the entire first insulating film 121. The second insulating film 122 in this example has a depression above the first aperture 131.

Then, in forming a gate electrode S 907, a gate electrode 140 is formed above the second insulating film 122. In forming a gate electrode S 907, a gate electrode 140 may be formed in the depression of the second insulating film 122. In forming a gate electrode S 907, a gate electrode 140 may be formed in a wider range than the depression of the second insulating film 122. The gate electrode 140 is, as one example, is formed by the vapor deposition method. The gate electrode 140 is, as one example, formed by the vapor deposition lift-off method. The gate electrode 140 may be formed by vapor depositing a plurality of electrode materials. Alternatively, the gate electrode 140 may be formed by the sputtering method.

Figure 11:
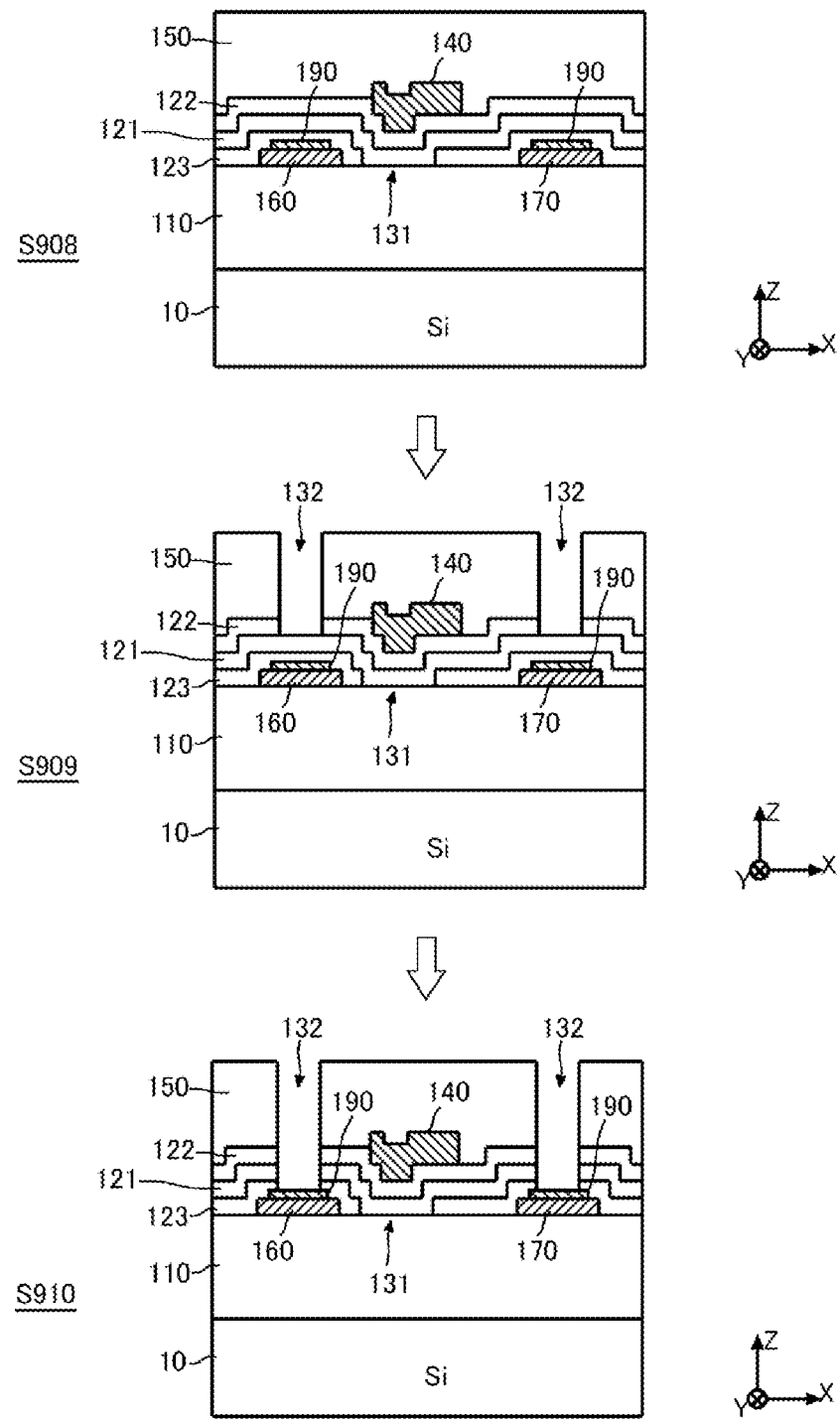
FIG. 11 illustrates an example of a process after forming a gate electrode S907.

FIG. 11 illustrates an example of a process after forming a gate electrode S 907. In this example, in forming a protective film S908, a protective film 150 is formed above the second insulating film 122 and the gate electrode 140. The protective film 150 may cover the entire second insulating film 122 and the entire gate electrode 140. The protective film 150 may be formed of an isolative material such as aluminum oxynitride. The protective film 150 may be formed by the CVD method, the ALD method, the sputtering method and so on. The protective film 150 may have a larger film thickness than any of the first insulating film 121, the second insulating film 122 and the third insulating film 123.

Then, in the second etching S 909, the second insulating film 122 is wet etched with an alkali solution, and each part of the second aperture 132 is formed. When the protective film 150 is formed of a material identical to the second insulating film 122, in the second etching S 909, the protective film 150 may also be wet etched. When the protective film 150 is formed of a different material from the second insulating film 122, before the second etching S 909, the protective film 150 is etched. The first insulating film 121 is exposed at the second aperture 132 by the second etching S 909.

Assuming that when the first insulating film 121 is etched by the second etching S 909, each electrode is protected by the barrier metal portion 190. Therefore, in the second etching S 909, source electrode 160 and the drain electrode 170 are not to be eroded.

Then, in the third etching S 910, the first insulating film 121 is etched, and the second aperture 132 is formed. In the third etching S 910, the first insulating film 121 may be dry etched. The barrier metal portion 190 is exposed at each second aperture 132 by the third etching S 910.

Figure 12:
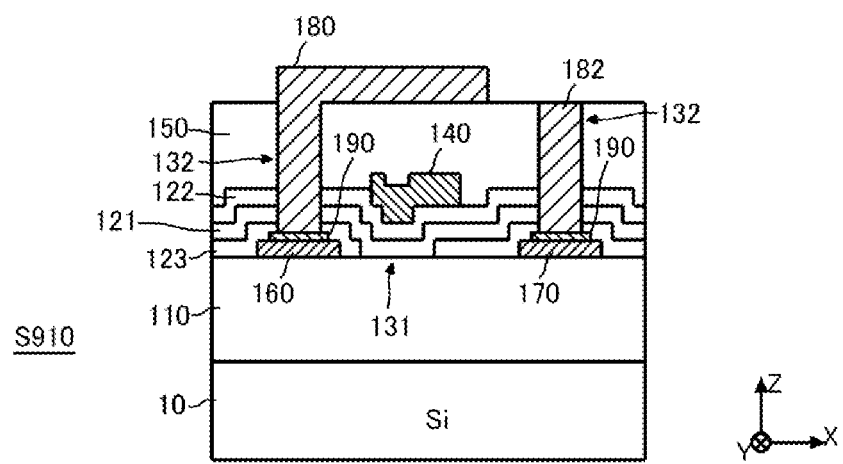
FIG. 12 illustrates an example of a process after a third etching S910.

FIG. 12 illustrates an example of a process after the third etching S 910. In this example, in forming a runner S910, each second aperture 132 is filled with a conductive material. In this way, the source runner 180 and the drain runner 182 are formed. This enables the formation of the semiconductor device 100.

Figure 13:
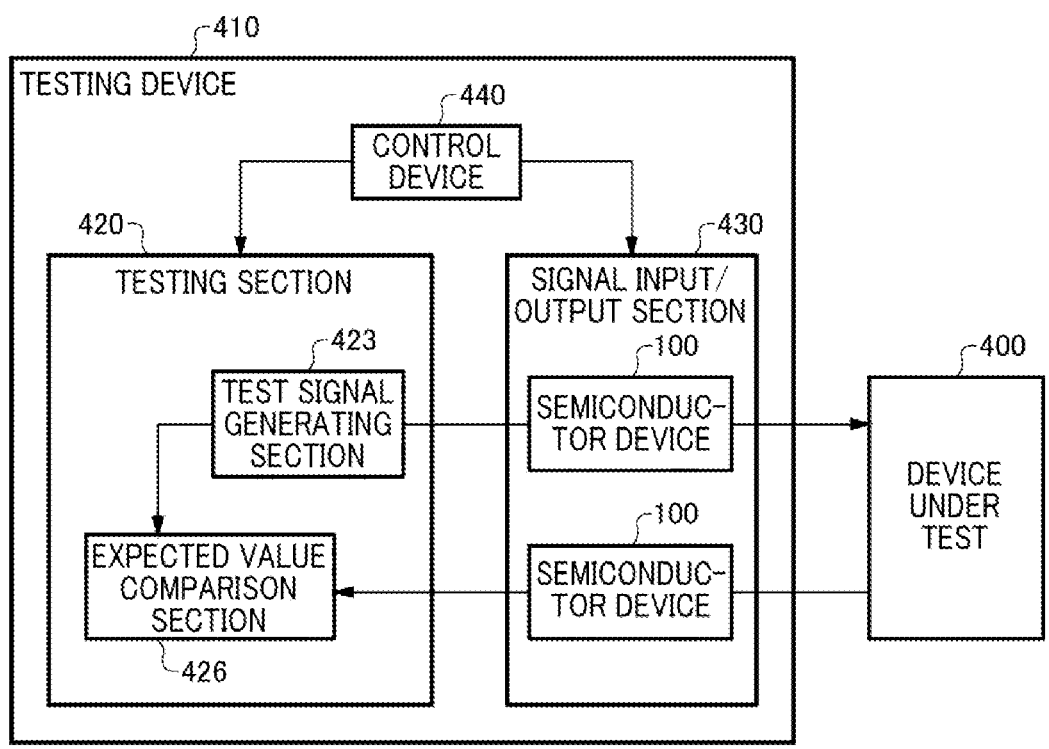
FIG. 13 illustrates a configuration example of a testing device 410 together with a device under test 400 according to one embodiment of the present invention.

FIG. 13 illustrates a configuration example of a testing device 410 together with a device under test 400 according to one embodiment of the present invention. The testing device 410 is configured to test a device under test 400 of at least one of an analog circuit, a digital circuit, a mixed analog/digital circuit, a memory, a system-on-chip (SOC) and so on. The testing device 410 is configured to input a test signal based on a test pattern for testing the device under test 400 to the device under test 400, and then to determine the quality of the device under test 400 based on the output signal output by the device under test 400 in response to the test signal.

The testing device 410 includes a testing section 420, a signal input/output section 430 and a control device 440. The testing section 420 is configured to exchange an electrical signal with the device under test 400 in between, and to test the device under test 400. The testing section 420 has a test signal generating section 423 and an expected value comparison section 426.

The test signal generating section 423 is connected to one or more devices under test 400 via the signal input/output section 430, and configured to generate a plurality of test signals that are supplied to the device under test 400. The test signal generating section 423 may be configured to generate an expected value of a response signal output by the device under test 400 in response to the test signal.

The expected value comparison section 426 is configured to compare a data value included in the response signal of the device under test 400 received from the signal input/output section 430, with an expected value generated by the test signal generating section 423. The expected value comparison section 426 is configured to determine the quality of the device under test 400 based on the comparison result.

The signal input/output section 430 is configured to electrically connect the device under test 400 to be tested and the testing section 420 in between, and to transmit the test signal generated by the test signal generating section 423 to the device under test 400. Also, the signal input/output section 430 is configured to receive the response signal output by the device under test 400 in response to the test signal. The signal input/output section 430 is configured to transmit the received response signal of the device under test 400 to the expected value comparison section 426. The signal input/output section 430 may be a performance board with a plurality of devices under test 400 mounted thereon. The signal input/output section 430 has a semiconductor device 100.

The semiconductor device 100 is provided between the testing section 420 and the device under test 400, and is configured to electrically connect or disconnect the testing section 420 and the device under test 400 in between. The testing device 410 may be configured to execute electrical connection or disconnection by the semiconductor device 100 according to the present embodiment.

In this example, a case where the signal input/output section 430 is connected to one device under test 400, and one semiconductor device 100 is respectively provided on the input signal line and the output signal line of one device under test 400 is described as an example. Alternatively, the signal input/output section 430 is connected to a plurality of devices under test 400, and one semiconductor device 100 may be respectively provided on the input signal line and the output signal line of a plurality of devices under test 400. Also, when there is one signal input/output line connected from the signal input/output section 430 to one device under test 400, one semiconductor device 100 may be provided on one input/output line.

The control device 440 is configured to transmit a control signal to the testing section 420 and the signal input/output section 430 to execute the test of the testing device 410. The control device 440 is configured to transmit a control signal to the testing section 420 to execute test signal generation or comparison of a test result with an expected value and so on, according to the test program. Also, the control device 440 is configured to transmit an instruction to the signal input/output section 430 for connection of the semiconductor device 100 provided on the signal input/output line to be connected and an instruction for disconnection of the semiconductor device 100 provided on the signal input/output line to be disconnected and so on, according to the test program.

The testing device 410 in the present embodiment described above can execute a test using the semiconductor device 100, which has high breakdown voltage, high output, and high frequency characteristics, while reducing the gate leak current and improving high frequency characteristics when a pulse is applied to the gate electrode.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: substrate; 100: semiconductor device; 110: compound semiconductor layer; 112: electron transit layer; 114; spacer layer; 116: electron supplying layer; 121: the first insulating film; 122: the second insulating film; 123: the third insulating film; 131: the first aperture; 132: the second aperture; 140: gate electrode; 141: body portion; 142: stepped portion; 150: protective film; 151: etching region; 160: source electrode; 161: etching region; 170: drain electrode; 180: source runner; 182: drain runner; 190: barrier metal portion; 191: the first barrier metal layer; 192: the second barrier metal layer; 400: device under test; 410: testing device; 420: testing section; 423: test signal generating section; 426: expected value comparison section; 430: signal input/output section; 440: control device

What is claimed is:

1. A semiconductor device, comprising:
   a compound semiconductor layer;
   a first insulating film provided on the compound semiconductor layer;
   a second insulating film, which is formed of a material with a larger band gap than the first insulating film, provided on the first insulating film; and
   a gate electrode provided above the second insulating film, wherein the first insulating film is in contact with the compound semiconductor layer at a first aperture, and wherein the first insulating film covers the compound semiconductor layer within the first aperture below a depression formed in the second insulating film.

2. The semiconductor device according to claim 1, further comprising:
   a source electrode and a drain electrode provided between the compound semiconductor layer and the first insulating film;
   a first barrier metal layer including a material more resistant to corrosion from an alkaline solution than the source electrode and the drain electrode, which is provided above the source electrode and the drain electrode; and
   a second barrier metal layer including platinum, which is provided above the first barrier metal layer; wherein the first insulating film and the second insulating film have a second aperture for exposing the second barrier metal layer.

3. The semiconductor device according to claim 2, wherein:
   the first barrier metal layer includes titanium.

4. The semiconductor device according to claim 2, wherein
   the second barrier metal layer has film thickness smaller than the first barrier metal layer.

5. The semiconductor device according to claim 3, wherein
   the second barrier metal layer has film thickness smaller than the first barrier metal layer.

6. The semiconductor device according to claim 2, wherein
   film thickness of the first barrier metal layer is 100 nm or more; and
   film thickness of the second barrier metal layer is 10 nm or more.

7. The semiconductor device according to claim 3, wherein
   film thickness of the first barrier metal layer is 100 nm or more; and
   film thickness of the second barrier metal layer is 10 nm or more.

8. A semiconductor device, comprising:
   a compound semiconductor layer;
   a first insulating film provided on the compound semiconductor layer;
   a second insulating film, which is formed of a material with a larger band gap than the first insulating film, provided on the first insulating film; and
   a gate electrode provided above the second insulating film, wherein
   the first insulating film is in contact with the compound semiconductor layer at a first aperture;
   the first insulating film includes tantalum oxynitride; and
   the second insulating film includes a material with a larger band gap than the tantalum oxynitride.

9. The semiconductor device according to claim 8, wherein
   the second insulating film includes aluminum oxynitride.

10. The semiconductor device according to claim 8, further comprising:
    a source electrode and a drain electrode provided between the compound semiconductor layer and the first insulating film;
    a first barrier metal layer including a material more resistant to corrosion from an alkaline solution than the source electrode and the drain electrode, which is provided above the source electrode and the drain electrode; and a second barrier metal layer including platinum, which is provided above the first barrier metal layer; wherein the first insulating film and the second insulating film have a second aperture for exposing the second barrier metal layer.

11. A semiconductor device, comprising:

a compound semiconductor layer;

a first insulating film provided on the compound semiconductor layer;

a second insulating film, which is formed of a material with a larger band gap than the first insulating film, provided on the first insulating film; and a gate electrode provided above the second insulating film; and a third insulating film having a first aperture for exposing the compound semiconductor layer below the gate electrode, which is provided between the first insulating film and the compound semiconductor layer; wherein the first insulating film is in contact with the compound semiconductor layer at the first aperture.

12. The semiconductor device according to claim 11, wherein the first insulating film includes tantalum oxynitride; and the second insulating film includes a material with a larger band gap than the tantalum oxynitride.

13. The semiconductor device according to claim 11, wherein:

the first insulating film has smaller film thickness when compared to the third insulating film.

14. The semiconductor device according to claim 13, wherein:

film thickness of the third insulating film is 20 nm or less.

* * * * *